United States Patent
Kobayashi

(10) Patent No.: US 8,271,925 B2
(45) Date of Patent: Sep. 18, 2012

(54) PRINTED BOARD DESIGN SYSTEM AND METHOD INCLUDING DECOUPLING CAPACITOR ARRANGEMENT EXAMINATION UNIT

(75) Inventor: Naoki Kobayashi, Tokyo (JP)

(73) Assignee: NEC Corporation, Tokyo (JP)

( * ) Notice: Subject to any disclaimer, the term of this patent is extended or adjusted under 35 U.S.C. 154(b) by 232 days.

(21) Appl. No.: 12/628,350

(22) Filed: Dec. 1, 2009

(65) Prior Publication Data

US 2010/0138802 A1 Jun. 3, 2010

(30) Foreign Application Priority Data

Dec. 1, 2008 (JP) ................................ 2008-306250

(51) Int. Cl.
*G06F 17/50* (2006.01)

(52) U.S. Cl. ......... 716/122; 716/106; 716/131; 716/132

(58) Field of Classification Search .................. 716/120, 716/122, 131, 137
See application file for complete search history.

(56) References Cited

U.S. PATENT DOCUMENTS

2002/0017907 A1* 2/2002 Araki et al. ................... 324/548

FOREIGN PATENT DOCUMENTS

| JP | 2000123062 A | 4/2000 |
|---|---|---|
| JP | 2002016337 A | 1/2002 |
| JP | 2002092059 A | 3/2002 |
| JP | 2004192618 A | 7/2004 |
| JP | 2006261470 A | 9/2006 |
| JP | 2007234853 A | 9/2007 |

OTHER PUBLICATIONS

Japanese Office Communication for JP2008-306250 issued Sep. 16, 2010.
Japanese Office Action for JP2008-306250 issued Nov. 17, 2010.

* cited by examiner

*Primary Examiner* — Vuthe Siek
*Assistant Examiner* — Mohammed Alam

(57) ABSTRACT

A decoupling capacitor pin position information obtain unit calculates based on board design data of a printed board, position information indicating positions of decoupling capacitors on the printed board. A power supply plane position/shape information obtain unit calculates based on the board design data, position/shape information indicating a position and shape of a power supply plane of the printed board. A restriction condition input unit collects restriction conditions from an input device. A decoupling capacitor examination unit judges based on the position information, the position/shape information and the restriction conditions, whether or not arrangement of the decoupling capacitors is adequate. Therefore, a designer, while designing arrangement/wiring of the printed board, can check in real time whether or not the arrangement of the decoupling capacitors is adequate, and thus can design at higher speed a printed board in which arrangement of decoupling capacitors is adequate.

16 Claims, 7 Drawing Sheets

PRINTED BOARD DESIGN SYSTEM AND METHOD INCLUDING DECOUPLING CAPACITOR ARRANGEMENT EXAMINATION UNIT

INCORPORATION BY REFERENCE

This application is based upon and claims the benefit of priority from Japanese patent application No. 2008-306250, filed on Dec. 1, 2008, the disclosure of which is incorporated herein in its entirety by reference.

TECHNICAL FIELD

The present invention relates to a printed board design system and a printed board design method, and more particularly, to a printed board design system and printed board design method which are used in designing a printed board which mounts a semiconductor circuit.

BACKGROUND ART

As an LSI (large scale integrated circuit) works at higher speed, has more number of signal pins, and works at lower voltage to mainly reduce power consumption, malfunction due to power supply noise is taken to be a more serious problem. In particular, as for an LSI classified as so-called high-end, total designing of silicon, packages and a board is becoming a mainstream. For example, it is very important to suppress power supply noise to an adequate level in a package board.

A power supply plane may receive, even when placed at a position far from a source of power supply noise, a certain level of noise from another power supply layer overlapping with the power supply plane, or the like, and depending on a shape of the power supply plane, a resonance with a frequency of the noise is occurred to amplify the noise large enough to invert a logic. For this reason, the necessity and effectiveness of a decoupling capacitor at a position far from the source of power supply noise are examined by using a method for checking, after completion of arrangement/wiring design of a board, whether or not there is any point on the power supply plane, at which power supply noise is abnormally large, through a PI (Power Integrity) simulation, EMI (Electro Magnetic Interference) simulation, or the like.

Japanese Laid Open Patent Application (JP-P2002-092059A) discloses a wiring design method of a printed wiring board, in which returning processes are eliminated. The design method of the printed wiring board executes arrangement/wiring processes by extracting a design restriction condition or a design allowable condition based on: circuit information based on product specification; NET information; an extraction condition determined in advance based on component information; or an extraction condition determined as necessary. The design method of the printed wiring board generates, by providing relaxing conditions to the arrangement/wiring process which fails to satisfy the above restriction condition or allowable condition, board data through partial design change without fundamentally reconfiguring the circuit information and arrangement/wiring.

Japanese Laid Open Patent Application (JP-P2004-192618A) discloses a layout check system that can accurately check whether a layout of PCB (Printed Circuit Board) allows a bypass capacitor on the PCB to function effectively. The layout check system checks layout data which defines a layout of a power source, a component having a power source pin and the bypass capacitor on a printed wiring board. The layout check system includes: storage means for storing the layout data including information based on which a first value and a second value are calculated, wherein the first value corresponds to impedance between the power source pin and the power source and the second value corresponds to impedance between the power source pin and the bypass capacitor; calculation means for calculating the first value and the second value based on the stored layout data; judgment means for judges whether the layout allows the bypass capacitor to function effectively by comparing the calculated first and second values in magnitude; and output means for outputting error information when the judgment means provide a negative judgment.

Japanese Laid Open Patent Application (JP-P2006-261470A) discloses a multilayer printed board capable of effectively arranging bypass capacitors in terms of the inhibition of radiation noises. The printed circuit board mounts a plurality of circuit elements. The printed circuit board includes a ground layer, a signal layer and a power supply layer for supplying power supply voltage to the circuit elements, which are laminated with each other via insulating member. A distance between a bypass capacitor and another bypass capacitor, which are arranged on the multilayer printed circuit board, is calculated based on information on the circuit elements. The bypass capacitors are arranged on the power supply layer at constant pitch in accordance with the distance.

Japanese Laid Open Patent Application (JP-P2007-234853A) discloses a method for checking effectiveness of a bypass capacitor, which can calculate, by considering switching current between plane layers as switching current between a power supply pin and a ground pin of an IC (Integrated Circuit), impedance between a power supply and a ground of the IC, between which an bypass capacitor is provided, such that the calculated impedance coincides with an measurement result. The method for checking the bypass capacitor includes: a storage step for storing design data of a printed board and information data of the IC; a calculation step for calculating, based on the stored design data, inductance H1 of a wiring from a power supply pin of the IC to a bypass capacitor, inductance H2 of a wiring from the bypass capacitor to a power supply via, inductance H3 of a wiring from a ground pin of the IC to the bypass capacitor, inductance H4 of a wiring from the bypass capacitor to a ground via, and electrostatic capacitance between a power supply plane layer and a ground plane layer; a calculation step for calculating, based on the inductance H1, the inductance H2, the inductance H3, the inductance H4, the electrostatic capacitance and the information data of the IC, a relation between impedance between the power supply pin and the ground pin of the IC and frequency of the impedance; a calculation step for calculating required impedance at an operating frequency of the IC based on the information data of the IC; and a judgment step for judging whether or not the bypass capacitor is effective by comparing the required impedance with the impedance between the power supply pin and the ground pin of the IC.

SUMMARY

With such a method, an examination cannot be made unless arrangement/wiring design of an entire board is completed, and long process TAT (Turn around Time) is required, so that a problem exists that the examination cannot be made in real time during the design in an early stage of arrangement/wiring design phase.

An exemplary object of the present invention is to perform real-time examination during arrangement/wiring design to eliminate an examination through simulation after the completion of the design and a regress to correct a problem detected in the examination through simulation by automatically examining in a design system by using a simple method whether or not a decoupling capacitor is required to be mounted at a position on a power supply plane, which is far from a source of power supply noise.

A printed board design system according to an exemplary aspect of the present invention includes a decoupling capacitor pin position information obtain unit, a power supply plan position/shape information obtain unit, a restriction information input unit, and a decoupling capacitor examination unit. The decoupling capacitor pin position information obtain unit calculates decoupling capacitor pin position information based on board design data of a printed board. The decoupling capacitor pin position information indicates positions of a plurality of decoupling capacitors to be mounted on the printed board. The power supply plan position/shape information obtain unit calculates power supply plane position/shape information based on the board design data. The power supply plane position/shape information indicates a position of a power supply plane of the printed board and a shape of the power supply plane. The restriction information input unit collects restriction conditions from an input device. The decoupling capacitor examination unit calculates a judgment result based on the decoupling capacitor pin position information, the power supply plane position/shape information and the restriction conditions. The judgment result indicates whether or not an arrangement of the plurality of decoupling capacitors is adequate.

A printed board design method according to another exemplary aspect of the present invention includes calculating decoupling capacitor pin position information based on board design data of a printed board, calculating power supply plane position/shape information based on the board design data, collecting restriction conditions from an input device, and calculating a judgment result based on the decoupling capacitor pin position information, the power supply plane position/shape information and the restriction conditions. The decoupling capacitor pin position information indicates positions of plurality of decoupling capacitors to be mounted on the printed board. The power supply plane position/shape information indicates a shape of a power supply plane of the printed board and a position of the power supply plane. The judgment result indicates whether or not an arrangement of the plurality of decoupling capacitors is adequate.

A computer-readable recording medium according to another exemplary aspect of the present invention records a program that when executed causes a computer to perform the above printed board design method.

According to the printed board design system, the printed board design method and the computer-readable recording medium, it can be judged by using the uncompleted board design data whether or not the plurality of decoupling capacitors are arranged at adequate positions on the power supply plane. Therefore, a designer, while designing arrangement/wiring of the printed board, can check in real time whether or not the plurality of decoupling capacitors are arranged at adequate positions on the power supply plane. As a result, for example, an examination by simulation after completion of the design can be eliminated, a regress to correct a problem detected in the examination can be eliminated, and a printed board in which arrangement of a plurality of decoupling capacitors is more adequate can be designed at higher speed.

According to the printed board design system, the printed board design method and the computer-readable recording medium, a designer, while designing arrangement/wiring of a printed board, can check in real time whether or not a plurality of decoupling capacitors are arranged at adequate positions on a power supply plane. As a result, a printed board in which arrangement of a plurality of decoupling capacitors is more adequate can be designed at higher speed.

BRIEF DESCRIPTION OF THE DRAWINGS

The above and other objects, advantages and features of the present invention will be more apparent from the following description of certain exemplary embodiments taken in conjunction with the accompanying drawings, in which.

EXEMPLARY EMBODIMENTS

Hereinafter, a printed board design system, a printed board design method and a computer-readable recording medium according to exemplary embodiments of the present invention will be described with reference to the attached drawings.

Figure 1:
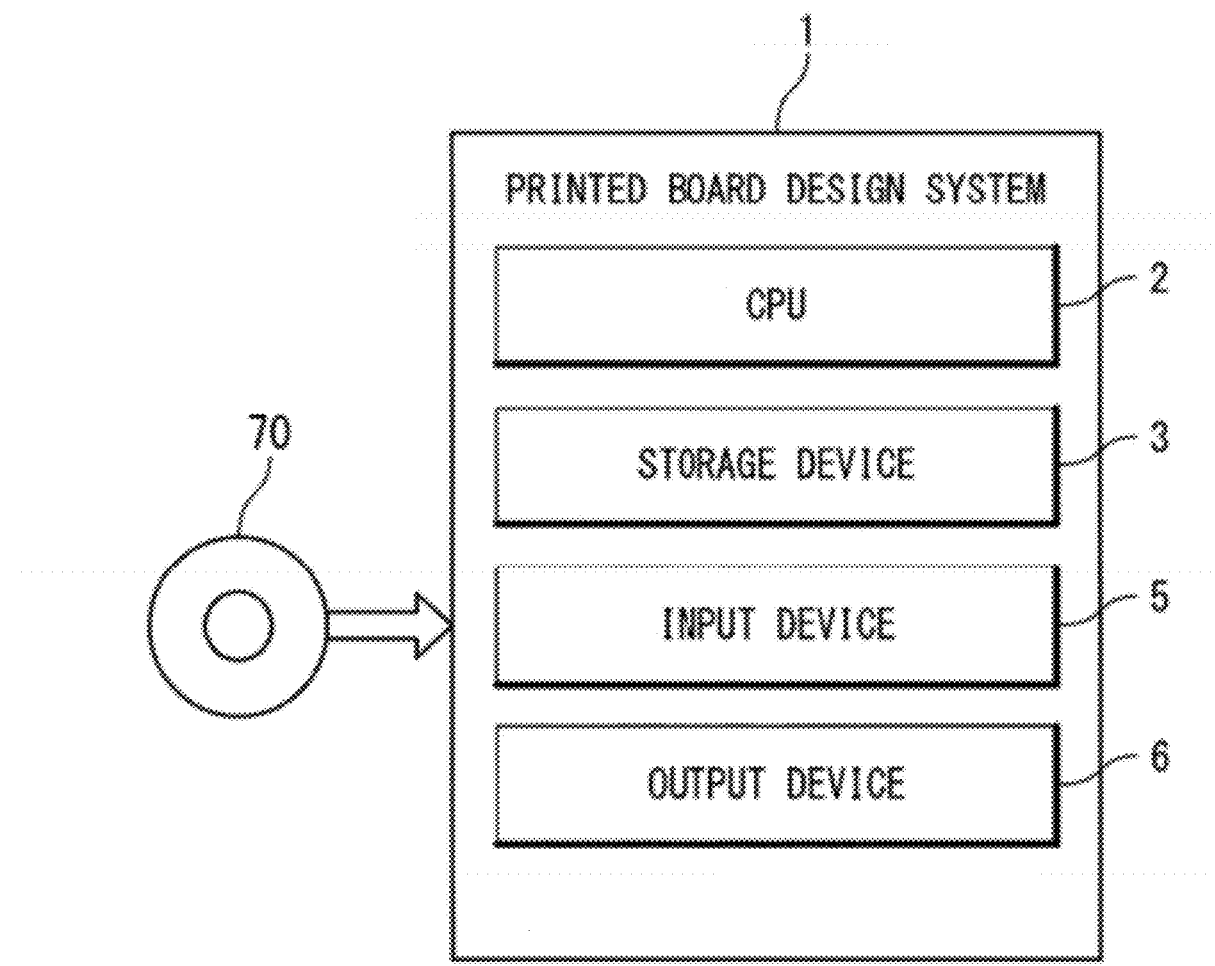
FIG. 1 is a block diagram of a printed board design system.

Referring to the drawings, a printed board design system according to an exemplary embodiment of the present invention is described. The printed board design system 1 is a computer, and as illustrated in FIG. 1, includes a CPU (Central Processing Unit) 2, a storage device 3, an input device 5, and an output device 6. A computer-readable recording medium 70 such as CD-ROM (Compact Disc Read Only Memory) records a computer program. The computer program is installed in the printed board design system 1. The CPU 2 executes the computer program installed in the printed board design system 1 to control the storage device 3, the input device 5, and the output device 6. The storage device 3 records the computer program, and temporarily records information generated by the CPU 2. The input device 5 is operated by a designer to thereby generate information, and output the information to the CPU 2. As the input device 5, a keyboard and a mouse are exemplified. The output device 6 is a display provided with a display surface, and displays images generated by the CPU 2 on the display surface such that the images are recognizable to the designer.

Figure 2:
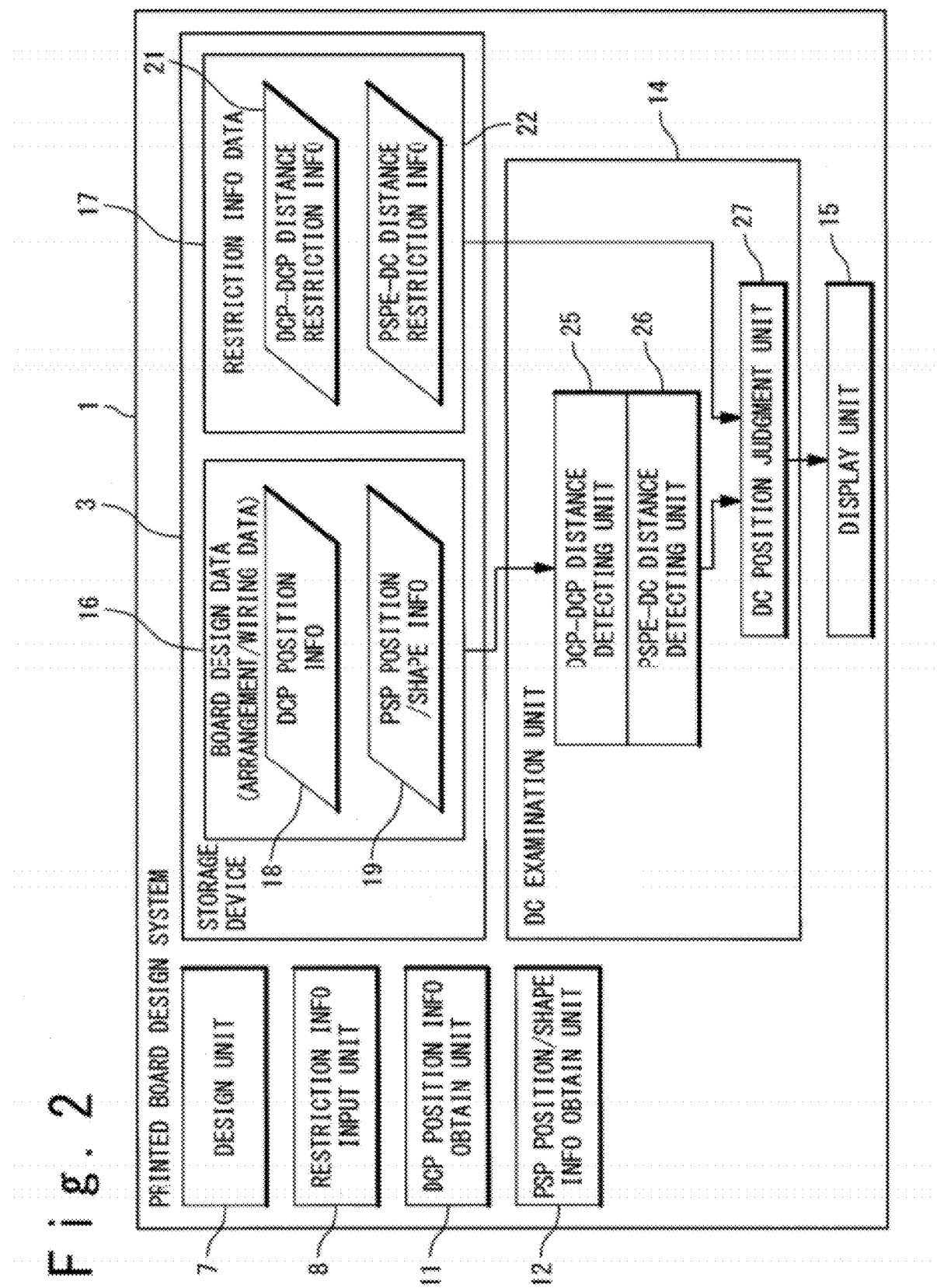
FIG. 2 is a block diagram of the printed board design system.

The computer program includes, as illustrated in FIG. 2, a design unit 7, a restriction information input unit 8, a decoupling capacitor pin position information obtain unit 11, a power supply plane position/shape information obtain unit 12, a decoupling capacitor examination unit 14, and a display unit 15.

The design unit 7 generates and updates board design data 16 based on information inputted from the input device 5, and records the board design data 16 in the storage device 3. The design unit 7 generates images based on the board design data 16 and displays the images on the output device 6. The board design data 16 is uncompleted design data on a printed board being designed. The board design data 16 indicates every logic information and physical information with respect to the board, such as information on a shape, a layered structure, and the like of the printed board, logic information and physical information on components to be mounted, a connectivity list, information on positions and shapes of the mounted components, information on positions and shapes of a wired signal net, a power supply plane, and a ground plane.

The restriction information input unit 8 records in the storage device 3 restriction information data 17 that is inputted with use of the input device 5. The restriction information data 17 indicates various restriction information on the printed board being designed, such as wiring lengths and wiring pitches in the signal net, and arrangement pitches of the components. The restriction data 17 further includes DCP-DCP (decoupling capacitor pin-decoupling capacitor pin) distance restriction information 21 and PSPE-DC (power supply plane edge-decoupling capacitor) distance restriction information 22. The DCP-DCP distance restriction information 21 indicates a condition of arrangement of a plurality of decoupling capacitors that are to be mounded on the printed board to be manufactured based on the board design data 16. The PSPE-DCP restriction information 22 indicates another condition of the arrangement of the plurality of decoupling capacitors that are to be mounted on the printed board to be manufactured based on the board design data 16.

The decoupling capacitor pin position information obtain unit 11 calculates decoupling capacitor pin position information 18 based on the board design data 16 every time when the board design data 16 is updated by the design unit 7. The decoupling capacitor pin position information 18 indicates a plurality of positions at which the plurality of decoupling capacitors to be respectively arranged. The plurality of decoupling capacitors are to be mounted on the printed board to be manufactured based on the board design data 16.

The power supply plane position/shape information obtain unit 12 calculates power supply plane position/shape information 19 based on the board design data 16 every time when the board design data 16 is updated by the design unit 7. The power supply plane position/shape information 19 indicates the shape of the power supply plane provided to the printed board to be manufactured based on the board design data 16, and the position at which the power supply plane is to be arranged.

The decoupling capacitor examination unit 14 calculates a judgment result based on the decoupling capacitor pin position information 18, the power supply plane position/shape information 19, and the restriction information data 17. The judgment result indicates whether or not the arrangement of the decoupling capacitors to be mounted on the printed board to be manufactured based on the board design data 16 is adequate. When the judgment result indicates the inadequacy, the decoupling capacitor examination unit 14 further calculates inadequate points of the decoupling capacitors.

The display unit 15 outputs the judgment result judged by the decoupling capacitor examination Unit 14 to the output device 6 to display the judgment result on the output device 6. When the judgment result indicates the inadequacy, the display unit 15 further displays the inadequate points calculated by the decoupling capacitor examination unit 14 on the display device 6.

The decoupling capacitor examination unit 14 includes a DCP-DCP distance detecting unit 25, a PSPE-DC distance detecting unit 26, and a decoupling capacitor position judgment unit 27 which are portions of the computer programs.

The DCP-DCP distance detecting unit 25 calculates DCP-DCP distances based on the decoupling capacitor pin position information 18. The DCP-DCP distance refers to an electrical distance between power supply pins of adjacent decoupling capacitors among the plurality of decoupling capacitors to be mounted on the printed board to be manufactured based on the board design data 16.

The PSPE-DC distance detecting unit 26 calculates PSPE-DC distances based on the decoupling capacitor pin position information 18 and the power supply plane position/shape information 19. The PSPE-DC distances are electrical distances between edges of the power supply plane provided to the printed board to be manufactured based on the board design data 16 and power supply pins of the plurality of decoupling capacitors to be mounted on the printed board.

The decoupling capacitor position judgment unit 27 calculates a judgment result based on the DCP-DCP distances calculated by the DCP-DCP distance detecting unit 25, the PSPE-DC distances calculated by the PSPE-DC distance detecting unit 26, and the restriction information data 17. When the DCP-DCP distances calculated by the DCP-DCP distance detecting unit 25 satisfy the condition of the DCP-DCP distance restriction information 21 and the PSPE-DC distances calculated by the PSPE-DC distance detecting unit 26 satisfy the condition of the PSPE-DC distance restriction information 22, the judgment result indicates that the arrangement of the decoupling capacitors to be mounted on the printed board to be manufactured based on the board design data 16 is adequate. On the other hand, when the DCP-DCP distances calculated by the DCP-DCP distance detecting unit 25 does not satisfy the condition of the DCP-DCP distance restriction information 21, or when the PCPE-DC distances calculated by the PSPE-DC distance detecting unit 26 does not satisfy the condition of the PSPE-DC distance restriction information 22, the judgment result indicates that the arrangement of the decoupling capacitors to be mounted on the printed board to be manufactured based on the board design data 16 is inadequate. The judgment result is same as the judgment result calculated by the decoupling capacitor examination unit 14.

When the judgment result indicates the inadequacy, the decoupling capacitor position judgment unit 27 further calculates adjacent decoupling capacitors between which the DCP-DCP distance does not satisfy the condition of the DCP-DCP distance restriction information 21, or an edge of the power supply plane and a decoupling capacitor between which the PSPE-DC distance does not satisfy the condition of the PSPE-DC distance restriction information 22.

Figure 3:
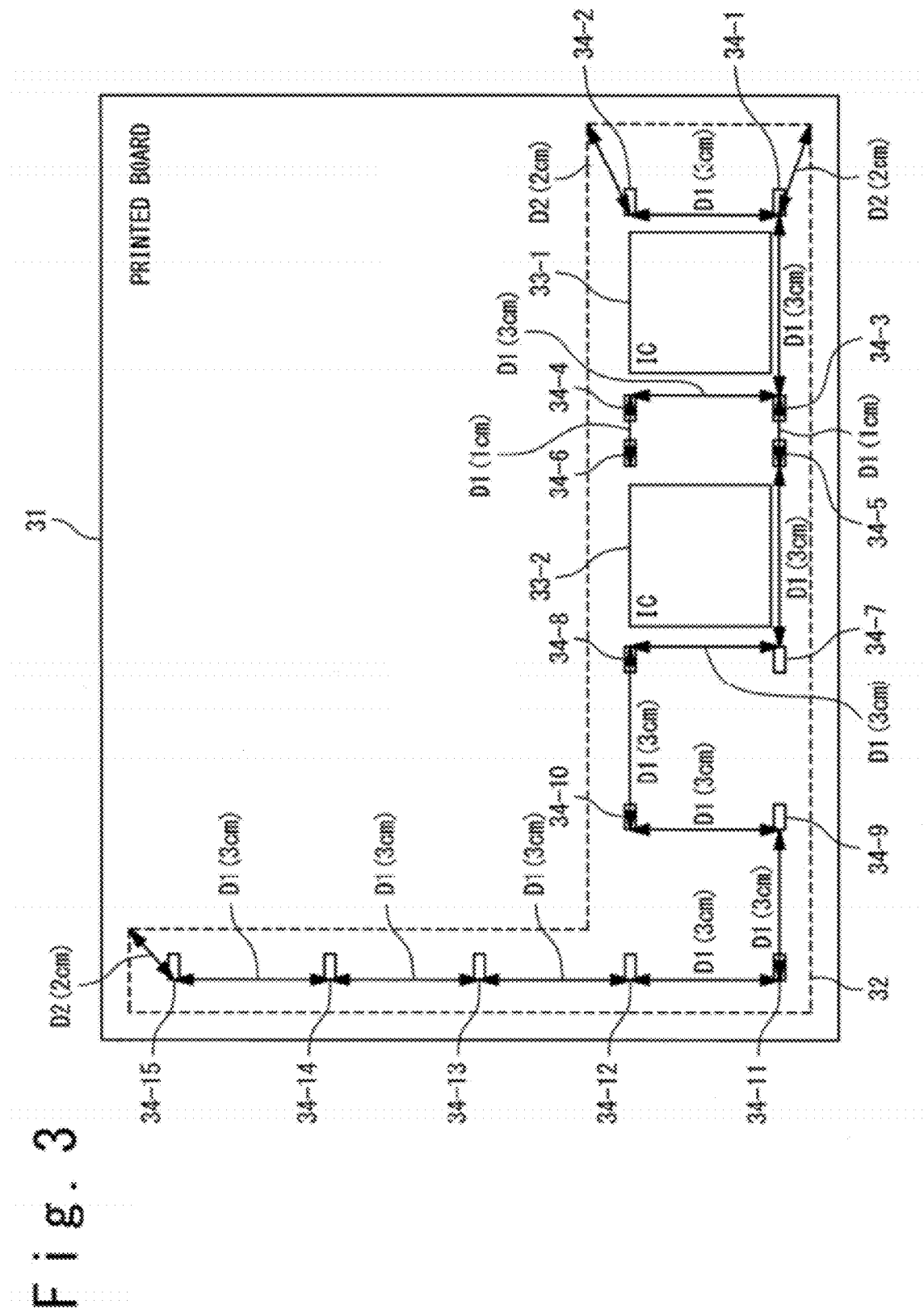
FIG. 3 is a plan view of a printed board in which an arrangement of decoupling capacitors is adequate.

FIG. 3 illustrates an example of the printed board to be manufactured based on the board design data 16. The printed board 31 is formed such that a plurality of planes are laminated. The plurality of planes are formed by conductive material such as metal, and insulated from one another. The plurality of planes include a power supply plane 32 and a not-shown ground plane. The power supply plane 32 is arranged in an inner layer of the printed board 31, and applied with power supply voltage. The ground plane is arranged in an inner layer of the printed board 31, and grounded.

The printed board 31 mounts a plurality of integrated circuits 33-1 and 33-2 and plurality of decoupling capacitors 34-1 to 34-15 on a surface layer thereof. The plurality of integrated circuits 33-1 and 33-2 are electrically connected to the power supply plane 32, and serve as sources of power supply noise, respectively. The plurality of decoupling capacitors 34-1 to 34-15 are electrically connected to the power supply plane 32 through power supply pins, are electrically connected to the ground plane, and prevent the noises generated by the plurality of integrated circuits 33-1 and 33-2 from being transmitted to other circuits, respectively.

Here, the decoupling capacitor pin position information 18 indicates positions on the printed board 31, at which the plurality of decoupling capacitors 34-1 to 34-15 are respectively arranged. More specifically, the decoupling capacitor pin position information 18 indicates the positions on the printed board 31, at which the power supply pins of the plurality of decoupling capacitors 34-1 to 34-15 are respectively arranged. The power supply plane position/shape information 19 indicates a shape of the power supply plane 32 and a position on the printed board 31 at which the power supply plane 32 is arranged.

At this time, the DCP-DCP distance detecting unit 25 calculates DCP-DCP distances D1 based on the decoupling capacitor pin position information 18. The every DCP-DCP distance is electrical distance between two adjacent decoupling capacitors among the plurality of decoupling capacitors 34-1 to 34-15. For example, the DCP-DCP distances are lengths of lines by which the plurality of decoupling capacitors 39-1 to 39-15 are connected in the form of tree structure such that the every line connects two adjacent two decoupling capacitor among the plurality of decoupling capacitors 34-1 to 34-15 and the lines are shorter.

The PSPE-DC distance detecting unit 26 calculates PSPE-DC distances D2 based on the decoupling capacitor pin position information 18 and the power supply plane position/shape information 19. The PSPE-DC distances are electrical distances between points on edges of the power supply plane 32 and decoupling capacitors among the plurality of decoupling capacitors 34-1 to 34-15, which are respectively electrically-closest to the points.

The DCP-DCP distance restriction information 21 indicates an upper limit of electrical distance between two adjacent decoupling capacitors among the plurality of decoupling capacitors to be mounted on the printed board to be manufactured based on the board design data 16. The PSPE-DC distance restriction information 22 indicates an upper limit of electrical distance between an edge of the power supply plane provided to the printed board to be manufactured based on the board design data 16 and a decoupling capacitor closest to the edge among the plurality of decoupling capacitors to be mounted on the printed board.

The decoupling capacitor position judgment unit 27 judges that the arrangement of the plurality of decoupling capacitors 34-1 to 34-15 is adequate when a maximum value of the DCP-DCP distances D1 is smaller than the upper limit of the DCP-DCP distance restriction information 21 and a maximum value of the PSPE-DC distances D2 is smaller than the upper limit of the PSPE-DC distance restriction information 22. On the other hand, when the maximum value of the DCP-DCP distances D1 is larger than the upper limit of the DCP-DCP distance restriction information 21, or when the maximum value of the PSPE-DC distances D2 is larger than the upper limit of the PSPE-DC distance restriction information 22, the decoupling position judgment unit 27 judges that the arrangement of the plurality of decoupling capacitors 39-1 to 39-15 is inadequate.

The decoupling capacitor position judgment unit 27 further calculates adjacent decoupling capacitors between which the DCP-DCP distance is larger than the upper limit of the DCP-DCP distance restriction information 21. The decoupling capacitor position judgment unit 27 further calculates an edge of the power supply plane and a decoupling capacitor between which the PSPE-DC distance is larger than the upper limit of the PSPE-DC distance restriction information 22. At this time, the display unit 15 displays the calculated adjacent decoupling capacitors on the output device 6, and displays a position of the calculated edge of the power supply plane and the calculated decoupling capacitor on the output device 6.

In the printed board 31, the maximum value of the DCP-DCP distances D1 is 3 cm, and the maximum value of the PSPE-DC distances D2 is 2 cm. When the upper limit of the DCP-DCP distance restriction information 21 is 5 cm and the upper limit of the PSPE-DC distance restriction information 22 is 3 cm, the decoupling capacitor position judgment unit 27 judges that the arrangement of the plurality of decoupling capacitors 34-1 to 34-15 of the printed board 31 is adequate.

Figure 4:
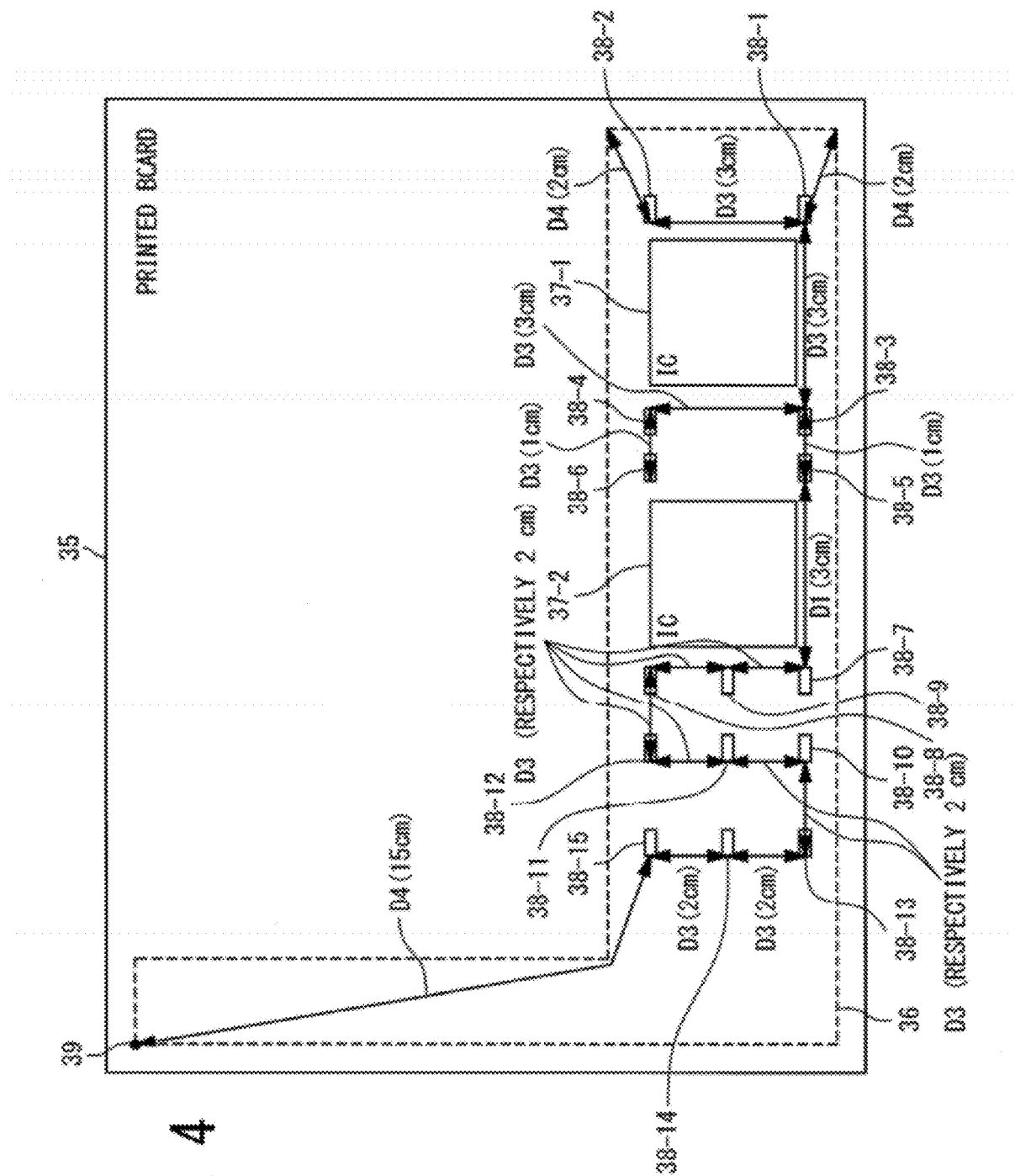
FIG. 4 is a plan view of a printed board in which an arrangement of decoupling capacitors is inadequate.

FIG. 4 illustrates another example of the printed board to be manufactured based on the board design data 16. As same as the already-described printed board 31, the printed board 35 is provided with a power supply plane 36 in an inner layer thereof, and mounts a plurality of integrated circuits 37-1 and 37-2 and plurality of decoupling capacitors 38-1 to 38-15 on a surface layer thereof.

In this example, a maximum value of DCP-DCP distances D3 calculated by the DCP-DCP distance detecting unit 25 is 3 cm. A maximum value of PSPE-DC distances D4 calculated by the PSPE-DC distance detecting unit 26 is 15 cm. When the upper limit of the DCP-DCP distance restriction information 21 is 5 cm and the upper limit of the PSPE-DC distance restriction information 22 is 3 cm, the decoupling capacitor position judgment unit 27 judges that an arrangement of the plurality of decoupling capacitors 38-1 to 38-15 of the printed board 35 is inadequate.

The decoupling capacitor position judgment unit 27 further calculates a point 39 on an edge of the power supply plane 36 and the decoupling capacitor 38-15 between which the PSPE-DC distance is 15 cm. At this time, the display unit 15 displays on the output device 6 an image indicating that the PSPE-DC distance between the point 39 on the edge of the power supply plane 36 and the decoupling capacitor 38-15 is inadequate.

Figure 5:
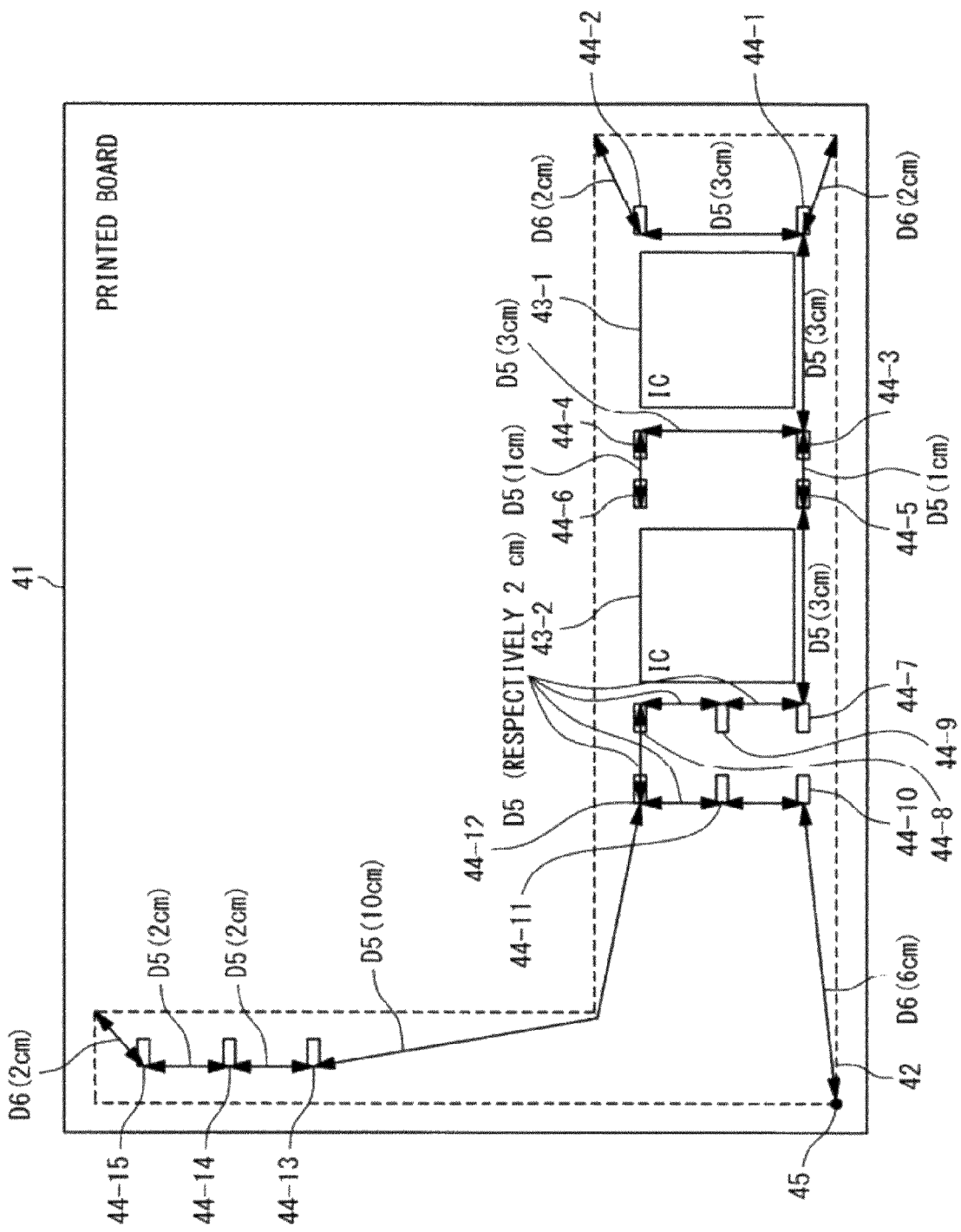
FIG. 5 is a plan view of another printed board in which an arrangement of decoupling capacitors is inadequate.

FIG. 5 illustrates still another example of the printed board to be manufactured based on the board design data 16. As same as the already-described printed board 31, the printed board 41 is provided with a power supply plane 42 in an inner layer thereof, and mounts a plurality of integrated circuits 43-1 and 43-2 and a plurality of decoupling capacitors 44-1 to 44-15 on a surface layer thereof.

In this example, a maximum value of DCP-DCP distances D5 calculated by the DCP-DCP distance detecting unit 25 is 10 cm. A maximum value of PSPE-DC distances D6 calculated by the PSPE-DC distance detecting unit 26 is 6 cm. When the upper limit of the DCP-DCP distance restriction information 21 is 5 cm and the upper limit of the PSPE-DC distance restriction information 22 is 3 cm, the decoupling capacitor position judgment unit 27 judges that an arrangement of the plurality of decoupling capacitors 44-1 to 44-15 of the printed board 41 is inadequate.

The decoupling capacitor position judgment unit 27 further calculates the decoupling capacitors 44-12 and 44-13 between which the DCP-DCP distance is inadequate. The decoupling capacitor position judgment unit 27 further calculates a point 45 on an edge of the power supply plane 42 and the decoupling capacitor 44-10 between which the PSPE-DC distance is inadequate. At this time, the display unit 15 displays on the output device 6 an image indicating that the DCP-DCP distance between the decoupling capacitors 44-12 and 44-13 is inadequate, and displays on the output device 6 an image indicating that the PSPE-DC distance between the point 45 on the edge of the power supply plane 42 and the decoupling capacitor 44-10 is inadequate.

in the printed board, when the maximum value of the DCP-DCP distances is larger than the predetermined value, or when the maximum value of the PSPE-DC distances is larger than the predetermined value, power supply noise may occur to cause malfunction and the like. For this reason, in such a judgment, it can be judged whether or not the arrangement of the decoupling capacitors is adequate.

A printed board design method according to the exemplary embodiment of the present invention is performed with use of the printed board design system 1, and includes: an operation of collecting restriction information; an operation of designing a printed board; an operation of judging whether or not arrangement of decoupling capacitors is adequate; and an operation of manufacturing the designed printed board.

In the operation of collecting the restriction information, the designer operates the input device 5 of the printed board design system 1 to input the restriction information data 17 into the printed board design system 1. The restriction information data 17 includes the DCP-DCP distance restriction information 21 and the PSPE-DC distance restriction information 22. In this case, the printed board design system 1 records the inputted DCP-DCP distance restriction information 21 and the PSPE-DC distance restriction information 22 in the storage device 3.

In the operation of designing the printed board, the designer operates the input device 5 of the printed board design system 1 to generate the board design data 16. The designer further operates the input device 5 of the printed board design system 1 to update the board design data 16 with reference to an image displayed on the output device 6 of the printed board design system 1. At this time, the printed board design system 1 records the generated board design data 16 in the storage device 3. The printed board design system 1 further stores the updated board design data 16 in the storage device 3 when the board design data 16 is updated.

The operation of determining whether or not the arrangement of the decoupling capacitors is adequate is performed every time when the board design data 16 obtains information required to judge whether or not the arrangement of the decoupling capacitors is adequate, and every time when the required information is updated.

The printed board design system 1 calculates the decoupling capacitor pin position information 18 based on the board design data 16. The printed board design system 1 calculates DCP-DCP distances based on the decoupling capacitor pin interval information 18. The DCP-DCP distances respectively indicate lengths of a plurality of lines by which a plurality of decoupling capacitors to be mounted on the printed board to be manufactured based on the board design data 16 are connected in the form of tree structure such that the every line connects two adjacent two decoupling capacitor among the plurality of decoupling capacitors and the lines are shorter.

The printed board design system 1 calculates the power supply plane position/shape information 19 based on the board design data 16. The printed board design system 1 calculates PSPE-DC distances based on the decoupling capacitor pin position information 18 and the power supply plane position/shape information 19. The DCPE-DC distances indicate electrical distances between points on edges of the power supply plane provided to the printed board to be manufactured based on the board design data 16 and decoupling capacitors among the plurality of decoupling capacitors to be mounted on the printed board, which are respectively electrically-closest to the points.

The printed board design system 1 calculates a judgment result based on the restriction information data 17, the calculated DCP-DCP distances, and the calculated PSPE-DC distances. When a maximum value of the DCP-DCP distances is smaller than the upper limit of the DCP-DCP distance restriction information 21 and a maximum value of the PSPE-DC distances is smaller than the upper limit of the PSPE-DC distance restriction information 22, the judgment result indicates that the arrangement of the plurality of decoupling capacitors is adequate. On the other hand, when the maximum value of the DCP-DCP distances is larger than the upper limit of the DCP-DCP distance restriction information 21, or when the maximum value of the PSPE-DC distances is larger than the upper limit of the PSPE-DC distance restriction information 22, the judgment result indicates that the arrangement of the plurality of decoupling capacitors is inadequate. The printed board design system 1 displays the calculated judgment result on the output device 6.

The designer refers to the judgment result during arrangement/wiring design of the printed board, and updates the board design data 16 through the operation of designing the printed board such that the judgment result indicates the adequacy. In the operation of manufacturing the printed board, the printed board is manufactured based on the board design data 16 that is designed such that the judgment result indicates the adequacy.

According to such a printed board design method, the designer can check during the arrangement/wiring design of the printed board whether or not the decoupling capacitors are arranged at adequate positions on the power supply plane. For this reason, the designer is required to perform neither an examination by simulation after completion of the design, nor a regress to correct a problem detected in the examination. Furthermore, according to such a printed board design method, in particular, the designer can check in an early stage of the arrangement/wiring design phase whether or nor the arrangement of the decoupling capacitors is adequate, and thus a process TAT of the board design can be shortened.

Note that the operation of judging whether or not the arrangement of the decoupling capacitors is adequate can also be performed at timings other than the update of the board design data 16. As those timings, periodic timings and timings designated by the designer are exemplified.

Figure 6:
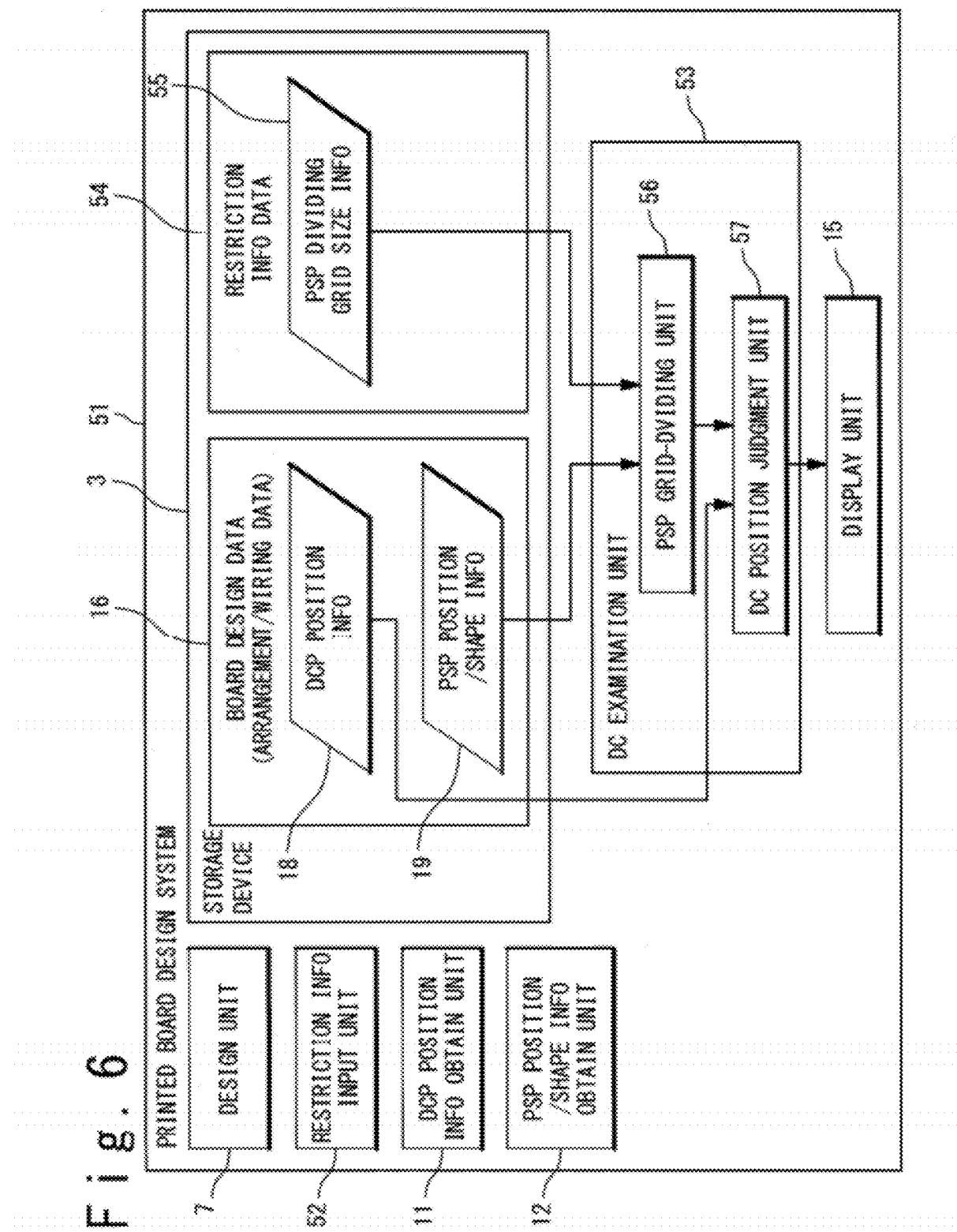
FIG. 6 is a block diagram of another printed board design system.

FIG. 6 illustrates a printed board design system according to another exemplary embodiment of the present invention. In the printed board design system 51, the restriction information input unit 8 and the decoupling capacitor examination unit 14 of the printed board design system 1 according to the already-described exemplary embodiment are respectively replaced by another restriction information input unit 52 and another decoupling capacitor examination unit 53.

The restriction information input unit 52 records in the storage device 3, restriction information data 54 that is inputted with use of the input device 5. The restriction information data 54 indicates various pieces of restriction information on a printed board being designed, such as wiring lengths and wiring pitches in the signal net, and arrangement pitches of the components. The restriction information data 54 further includes PSP (power supply plane) dividing grid size information 55. The PSP dividing grid size information 55 indicates a condition of arrangement of a plurality of decoupling capacitors to be mounted on the printed board to be manufactured based on the board design data 16, and indicates a dividing grid size.

The decoupling capacitor examination unit 53 calculates a judgment result based on the decoupling capacitor pin position information 18, the power supply plane position/shape information 19, and the restriction information data 54. The judgment result indicates whether or not the arrangement of the decoupling capacitors to be mounted on the printed board to be manufactured based on the board design data 16 is adequate. When the judgment result indicates the inadequacy, the decoupling capacitor examination unit 53 further calculates corresponding inadequate points.

The decoupling capacitor examination unit 53 includes a PSP grid-dividing unit 56 and a DC (decoupling capacitor) position judgment unit 57 that are portions of the computer program.

The PSP grid-dividing unit 56 calculates based on the power supply plane position/shape information 19 and the PSP dividing grid size information 55, a plurality of regions on a surface layer of the printed board to be manufactured based on the board design data 16. The plurality of regions refers to regions on the surface layer, which are divided from a region in which the power supply plane provided to the printed board is arranged. Each of the plurality of regions is formed in a quadrate of which side length is equal to the dividing grid size indicated by the PSP dividing grid size information 55, or in a rectangle of which all side lengths are shorter than the dividing grid size.

The DC position judgment unit 57 calculates a judgment result based on the decoupling capacitor pin position information 18 and the plurality of regions calculated by the PSP grid-dividing unit 56. The judgment result indicates that the arrangement of the decoupling capacitors to be mounted on the printed board to be manufactured based on the board design data 16 is adequate when the decoupling capacitors are respectively arranged in the plurality of regions. The judgment result indicates that the arrangement of the decoupling capacitors to be mounted on the printed board to be manufactured based on the board design data 16 is adequate when at least one of the decoupling capacitors is arranged in any of the plurality of regions. On the other hand, when no decoupling capacitor is arranged in some of the plurality of regions, the judgment result indicates that the arrangement of the decoupling capacitors to be mounted on the printed board to be manufactured based on the board design data 16 is inadequate. When no decoupling capacitor is arranged in at least one of the plurality of regions, the judgment result indicates that the arrangement of the decoupling capacitors to be mounted on the printed board to be manufactured based on the board design data 16 is inadequate. The judgment result is same as the judgment result calculated by the decoupling capacitor examination unit 53.

When the judgment result indicates the inadequacy, the DC position judgment unit 57 further calculates the regions among the plurality of regions, in which no decoupling capacitor is arranged. At this time, the display unit 15 displays on the output device 6 an image indicating the calculated regions are inadequate.

Figure 7:
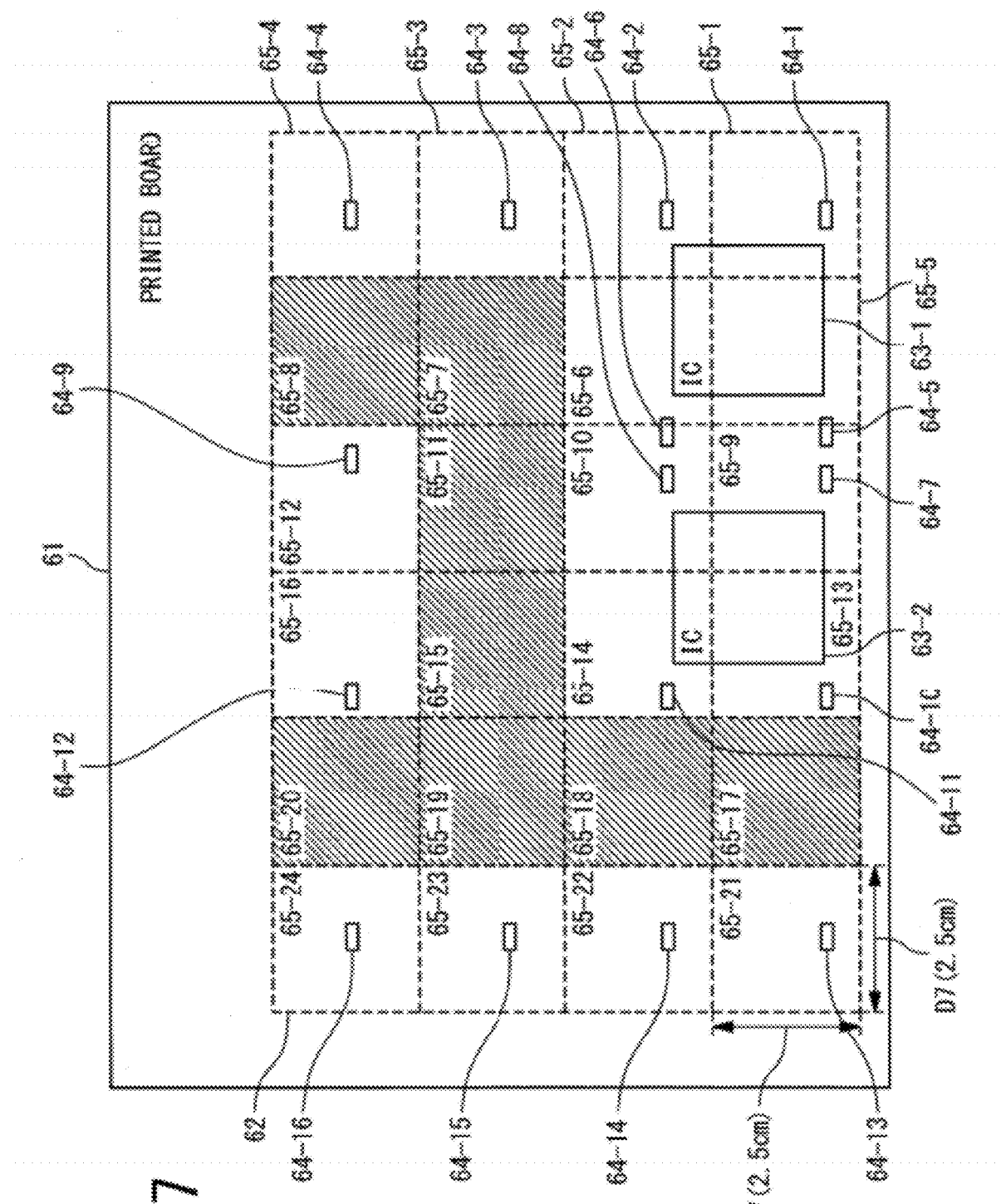
FIG. 7 is a plan view of still another printed board in which an arrangement of decoupling capacitors is inadequate.

FIG. 7 illustrates an example of the printed board to be manufactured based on the board design data 16. The printed board 61 is provided with a power supply plane 62 in an inner layer thereof, and mounts a plurality of integrated circuits 63-1 and 63-2 and a plurality of decoupling capacitors 64-1 to 64-16 on a surface layer thereof.

In this example, a region in which the power supply plane 62 is arranged is divided into a plurality of regions 65-1 to 65-24 by the PSP grid-dividing unit 56. Each of the plurality of regions 65-1 to 65-24 is formed in a quadrate of which side length is equal to the dividing grid size (2.5 cm) indicated by the PSP dividing grid size information 55. In the regions 65-7, 65-8, 65-11, 65-15, 65-17, 65-18, 65-19, and 65-20 among the plurality of regions 65-1 to 65-24, no decoupling capacitor is arranged. For this reason, the DC position judgment unit 57 judges that arrangement of the plurality of decoupling capacitors 64-1 to 64-16 of the printed board 61 is inadequate. At this time, the display unit 15 displays on the output device 6 an image indicating that the regions 65-7, 65-8, 65-11, 65-15, 65-17, 65-18, 65-19, and 65-20 are inadequate.

In the printed board, power supply noise may occur to cause malfunction when no decoupling capacitor is arranged in a pattern in the power supply plane, which has a predetermined distance across the pattern. For this reason, in such a judgment, it can be judged whether or not the arrangement of the decoupling capacitors is adequate.

As same as the printed board design system 1, the printed board design system 51 is used in a printed board design method according to the other exemplary embodiment of the present invention. As same as the printed board design method according to the above-mentioned exemplary embodiment, according to such a printed board design method, the designer can check during the arrangement/wiring design of the printed board whether or not the decoupling capacitors are arranged at adequate positions on the power supply plane. For this reason, the designer is required to perform neither an examination by simulation after completion of the design, nor a regress to correct a problem detected in the examination. Furthermore, according to such a printed board design method, in particular, the designer can check in an early stage of the arrangement/wiring design phase whether or nor the arrangement of the decoupling capacitors is adequate, and thus a process TAT of the board design can be shortened.

Note that the plurality of divided regions can also be formed as patterns other than rectangles. Respective distances across the patterns are smaller than the dividing grid size indicated by the PSP dividing grid size information 55 and the patterns can fill the region on the surface layer of the printed board, in which the power supply plane is arranged. For example, the patterns are regular hexagons. As same as the division into rectangles, such division can be applied to the judgment whether or not the arrangement of the decoupling capacitors is adequate.

While the invention has been particularly shown and described with reference exemplary embodiments thereof, the invention is not limited to these embodiments. It will be understood by those skilled in the art that various changes in form and details may be made therein without departing from the spirit and scope of the present invention as defined by the claims.

What is claimed is:

1. A printed board design system comprising:
   hardware;
   a decoupling capacitor pin position information obtain unit implemented at least by the hardware and which calculates decoupling capacitor pin position information based on board design data of a printed board, wherein said decoupling capacitor pin position information indicates positions of a plurality of decoupling capacitors to be mounted on said printed board;
   a power supply plan position/shape information obtain unit implemented at least by the hardware and which calculates power supply plane position/shape information based on said board design data, wherein said power supply plane position/shape information indicates a position of a power supply plane of said printed board and a shape of said power supply plane;
   a restriction information input unit implemented at least by the hardware and which collects restriction conditions from an input device, said restriction conditions restricting said positions of said decoupling capacitors to be mounted on said printed board; and
   a decoupling capacitor examination unit implemented at least by the hardware and which calculates a judgment result based on said decoupling capacitor pin position information, said power supply plane position/shape information and said restriction conditions, wherein said judgment result indicates whether or not an arrangement of said plurality of decoupling capacitors is adequate, wherein said restriction conditions indicate a DCP-DCP (decoupling capacitor pin-decoupling capacitor pin) distance upper limit, said decoupling capacitor examination unit includes:

a DCP-DCP distance detecting unit which calculates DCP-DCP distances based on said decoupling capacitor pin position information;

a decoupling capacitor position judgment unit which calculates said judgment result based on said decoupling capacitor pin position information, said power supply plane position/shape information and said restriction conditions, each of said DCP-DCP distances indicates electrical distance between power supply pins of two adjacent decoupling capacitors among said plurality of decoupling capacitors, when a maximum value of said DCP-DCP distances is larger than said DCP-DCP distance upper limit, said judgment result indicates that said arrangement of said plurality of decoupling capacitors fails said restriction conditions.

2. The printed board design system according to claim 1, wherein said restriction conditions further indicate a PSPE-DC (power supply plane edge-decoupling capacitor) distance upper limit, said decoupling capacitor examination unit further includes:

a PSPE-DC distance detecting unit which calculates PSPE-DC distances based on said decoupling capacitor pin position information and said power supply plane position/shape information; and said PSPE-DCP distances indicates electrical distances between edges of said power supply plane and power supply pins of said plurality of decoupling capacitors, and when a maximum value of said PSPE-DC distances is larger than said PSPE-DC distance upper limit, said judgment result indicates that said arrangement of said plurality of decoupling capacitors fails said restriction conditions.

3. The printed board design system according to claim 2, further comprising a design unit which updates said board design data based on information inputted from an input device.

4. The printed board design system according to claim 3, wherein said decoupling capacitor pin information obtain unit calculates said decoupling capacitor pin position information based on said board design data when said board design data is updated, and said power supply plane position/shape information obtain unit calculates said power supply plane position/shape information based on said board design data when said board design data is updated.

5. The printed board design system according to claim 1, said restriction conditions indicates a power supply plane dividing grid size, said decoupling capacitor examination unit includes:

a power supply plane grid-dividing unit which divides a region in which said power supply plane is arranged into a plurality of regions based on said power supply plane position/shape information and said power supply plane dividing grid size; and a decoupling capacitor position judgment unit which judges based on said decoupling capacitor pin position information whether or not at least one of said plurality of said decoupling capacitors is arranged in any of said plurality of regions, respective distances across said plurality of regions are smaller than said power supply plane dividing grid size, and when none of said plurality of decoupling capacitors is arranged in at least one of said plurality of regions, said judgment result indicates that said arrangement of said plurality of decoupling capacitors fails said restriction conditions.

6. The printed board design system according to claim 5, wherein said plurality of regions are respectively rectangles.

7. A printed board design method comprising:

calculating, by a computing device, decoupling capacitor pin position information based on board design data of a printed board, wherein said decoupling capacitor pin position information indicates positions of plurality of decoupling capacitors to be mounted on said printed board;

calculating, by the computing device, power supply plane position/shape information based on said board design data, wherein said power supply plane position/shape information indicates a shape of a power supply plane of said printed board and a position of said power supply plane;

collecting, by the computing device, restriction conditions from an input device, said restriction conditions restricting said positions of said decoupling capacitors to be mounted on said printed board;

calculating, by the computing device, a judgment result based on said decoupling capacitor pin position information, said power supply plane position/shape information and said restriction conditions, wherein said judgment result indicates whether or not an arrangement of said plurality of decoupling capacitors is adequate;

calculating, by the computing device, DCP-DCP (decoupling capacitor pin-decoupling capacitor pin) distances based on said decoupling capacitor pin position information; and wherein said restriction conditions indicate a DCP-DCP distance upper limit, each of said DCP-DCP distances indicates electrical distance between power supply pins of two adjacent decoupling capacitors among said plurality of decoupling capacitors, when a maximum value of said DCP-DCP distances is larger than said DCP-DCP distance upper limit, said judgment result indicates that said arrangement of said plurality of decoupling capacitors fails said restriction conditions.

8. The printed board design method according to claim 7, further comprising:

calculating PSPE-DC (power supply plane edge-decoupling capacitor) distances based on said decoupling capacitor pin position information and said power supply plane position/shape information, wherein said restriction conditions further indicate a PSPE-DC distance upper limit, said PSPE-DCP distances indicates electrical distances between edges of said power supply plane and power supply pins of said plurality of decoupling capacitors, and when a maximum value of said PSPE-DC distances is larger than said PSPE-DC distance upper limit, said judgment result indicates that said arrangement of said plurality of decoupling capacitors fails said restriction conditions.

9. The printed board design method according to claim 8, further comprising updating said board design data based on information inputted from an input device,
wherein said calculating said DCP-DCP distances and said calculating said PSPE-DC distances are performed when said board design data is updated.

10. The printed board design method according to claim 7, further comprising:
dividing a region in which said power supply plane is arranged into a plurality of regions based on said power supply plane position/shape information and a power supply plane dividing grid size; and
judging based on said decoupling capacitor pin position information whether or not at least one of said plurality of said decoupling capacitors is arranged in any of said plurality of regions,
wherein said restriction conditions indicates said power supply plane dividing grid size,
respective distances across said plurality of regions are smaller than said power supply plane dividing grid size, and
when none of said plurality of decoupling capacitors is arranged in at least one of said plurality of regions, said judgment result indicates that said arrangement of said plurality of decoupling capacitors fails said restriction conditions.

11. The printed board design method according to claim 10, wherein said plurality of regions are respectively rectangles.

12. A non-transitory computer-readable recording medium having recorded thereon a program that when executed causes a computer to perform a method comprising:
calculating decoupling capacitor pin position information based on board design data of a printed board, wherein said decoupling capacitor pin position information indicates positions of plurality of decoupling capacitors to be mounted on said printed board;
calculating power supply plane position/shape information based on said board design data, wherein said power supply plane position/shape information indicates a shape of a power supply plane of said printed board and a position of said power supply plane;
collecting restriction conditions from an input device, said restriction conditions restricting said positions of said decoupling capacitors to be mounted on said printed board;
calculating a judgment result based on said decoupling capacitor pin position information, said power supply plane position/shape information and said restriction conditions, wherein said judgment result indicates whether or not an arrangement of said plurality of decoupling capacitors is adequate;
calculating DCP-DCP (decoupling capacitor pin-decoupling capacitor pin) distances based on said decoupling capacitor pin position information; and
wherein said restriction conditions indicate a DCP-DCP distance upper limit,
each of said DCP-DCP distances indicates electrical distance between power supply pins of two adjacent decoupling capacitors among said plurality of decoupling capacitors,
when a maximum value of said DCP-DCP distances is larger than said DCP-DCP distance upper limit, said judgment result indicates that said arrangement of said plurality of decoupling capacitors fails said restriction conditions.

13. The non-transitory computer-readable recording medium of claim 12, wherein the method further comprises:
calculating PSPE-DC (power supply plane edge-decoupling capacitor) distances based on said decoupling capacitor pin position information and said power supply plane position/shape information,
wherein said restriction conditions further indicate a PSPE-DC distance upper limit,
said PSPE-DCP distances indicates electrical distances between edges of said power supply plane and power supply pins of said plurality of decoupling capacitors, and
when a maximum value of said PSPE-DC distances is larger than said PSPE-DC distance upper limit, said judgment result indicates that said arrangement of said plurality of decoupling capacitors fails said restriction conditions.

14. The printed board design system of claim 1, wherein said judgment result is calculated without determining impedance.

15. The printed board design method of claim 7, wherein said judgment result is calculated without determining impedance.

16. The non-transitory computer-readable recording medium of claim 12, wherein said judgment result is calculated without determining impedance.

* * * * *